(12) United States Patent
Tsuda et al.

(10) Patent No.: US 7,067,963 B2
(45) Date of Patent: Jun. 27, 2006

(54) SURFACE ACOUSTIC WAVE DEVICE

(75) Inventors: Tadaaki Tsuda, Tokyo (JP); Yasushi Yamamoto, Tokyo (JP); Hiroshi Kawahara, Tokyo (JP); Yoshihiro Takahashi, Tokyo (JP); Minoru Sakai, Tokyo (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 603 days.

(21) Appl. No.: 09/983,250

(22) Filed: Oct. 23, 2001

(65) Prior Publication Data

US 2002/0047501 A1 Apr. 25, 2002

(30) Foreign Application Priority Data

Oct. 24, 2000 (JP) ....................... 2000-323977

(51) Int. Cl.
H01L 41/053 (2006.01)

(52) U.S. Cl. .................................... 310/348; 310/313 R
(58) Field of Classification Search ............. 310/313 R, 310/340, 348
See application file for complete search history.

(56) References Cited

U.S. PATENT DOCUMENTS

| 5,291,059 A | * | 3/1994 | Ishitsuka et al. ............. 257/666 |
| 5,343,076 A | * | 8/1994 | Katayama et al. ........... 257/717 |
| 5,440,170 A | * | 8/1995 | Tsuji et al. .................. 257/676 |
| 5,760,526 A | | 6/1998 | Anderson ............... 310/313 R |
| 5,892,417 A | * | 4/1999 | Johnson et al. ............. 333/193 |
| 5,963,433 A | * | 10/1999 | Kim ............................ 361/813 |
| 5,969,461 A | * | 10/1999 | Anderson et al. ........ 310/313 R |
| 6,048,754 A | * | 4/2000 | Katayama et al. .......... 438/115 |
| 6,058,020 A | * | 5/2000 | Winterer et al. ............. 361/767 |
| 6,252,299 B1 | * | 6/2001 | Masuda et al. .............. 257/686 |
| 6,376,905 B1 | * | 4/2002 | Hisano et al. .............. 257/690 |
| 6,404,100 B1 | * | 6/2002 | Chujo et al. ............ 310/313 R |
| 2002/0043899 A1 | * | 4/2002 | Kishimoto .................... 310/348 |
| 2002/0140322 A1 | * | 10/2002 | Suga et al. .................. 310/348 |
| 2004/0217670 A1 | * | 11/2004 | Ueda et al. ............. 310/313 R |
| 2004/0245891 A1 | * | 12/2004 | Kawachi et al. ......... 310/313 R |
| 2005/0029906 A1 | * | 2/2005 | Miyaji ........................ 310/348 |

FOREIGN PATENT DOCUMENTS

| DE | 3539518 | 5/1987 |
| JP | 63-131415 | 8/1988 |
| JP | 6-151645 | * 11/1992 |
| JP | 5-63495 | 3/1993 |
| JP | 6-188672 | 7/1994 |
| JP | 08-288776 | 11/1996 |
| JP | 10-93383 | 4/1998 |

OTHER PUBLICATIONS

Japanese Office Action dated Sep. 12, 2002 with a partial English translation.
European Search Report dated Nov. 12, 2003.

* cited by examiner

Primary Examiner—Thomas M. Dougherty
(74) Attorney, Agent, or Firm—McGinn IP Law Group, PLLC

(57) ABSTRACT

In the surface acoustic wave device including a lead frame made of metal in which a plurality of inner leads 9 are formed, wherein a chip 1 comprising at least one piezoelectric substrate is mounted on a resin base 3 into which a lead frame is molded integrally, are provided a wire lead section metal surface 7a that is formed by exposing a wire lead section 7, which is electrically connected with an electrode of the chip through a bonding wire 4, out of inner leads that are arranged on both sides of the chip, from the resin base, and a chip lead section metal surface 10a that is formed by exposing a chip lead section 10, which is partially covered with the chip, from the resin base.

22 Claims, 11 Drawing Sheets

SURFACE ACOUSTIC WAVE DEVICE

BACKGROUND OF THE INVENTION

The present invention relates to a surface acoustic wave device such as a resonator, a filter and so forth that is housed in a mobile communication apparatus such as a mobile telephone and so forth. More particular, the present invention relates to a package structure and a manufacturing method of the surface acoustic wave device.

Conventionally, for the surface acoustic wave device, a ceramic package for surface mounting, and a metal package by cold weld or electro-deposition have been employed.

FIG. 11 is a view illustrating a section of the surface acoustic wave device using the conventional ceramic package.

As shown in this Fig., in general, for the ceramic package is employed a multi-layer structure of a first ceramic layer 118, a second ceramic layer 119, and a third ceramic layer 120.

Further, in order to cover a top portion thereof with a cap 122, a metal ring 121 was brazed.

In such a multi-layer ceramic package, it is necessary to electrically connect a chip 101 comprising a piezoelectric substrate such as a crystal and so forth, and an external terminal 114 that is a pad for surface mounting.

Namely, a wire or a through hole is provided for a part of each ceramic layer, and a connection of the chip 101 to the external terminal 114 is made by taking a route from a bonding pad 117 mounted on the top side of the second ceramic layer 119 to an internal wiring 115.

The chip 101 is fastened to and mounted on the part of the first ceramic layer 118 with an adhesive 102 wherein metal plating 116 was formed.

Wiring of the chip 101 and the bonding pad 117 is carried out with a bonding wire 104.

Thereafter, the cap 122 is laid on the metal ring 121, a hollow section 105 is provided over the top face of the chip 101, and sealing is carried out with seam welding and so forth.

As to the sealing method, there is also the method of employing solder, gold-tin and so forth in addition to the seam welding.

In the surface acoustic wave device using the above-mentioned ceramic package, however a first problem exists that low pricing is difficult.

Namely, this is because, in the surface acoustic wave device using the ceramic package, since routing of the internal wiring becomes necessary and the multi-layer of the ceramic is required, a die for manufacturing becomes necessary every time the wiring layout is changed.

Also, this is because, as to the sealing method, in the case of the seam welding, it is necessary to braze the metal ring 121 on the ceramic, and also in the case of the solder sealing, it is unavoidable to prepare a special solder lid.

As the other conventional examples, the examples using the resin package were disclosed in JP-A-63495/1993 and JP-A-188672/1994.

In JP-A-63495/1993, was illustrated the example of a resin-mold peripheral unit having a hollow section on the top face of the surface acoustic wave element fastened to the lead frame, and, in this example, a conducting layer was provided in the internal surface thereof or a conductive resin was employed for the peripheral unit and it was illustrated that a lead wire was covered with an insulating film to wire it to an external terminal through the peripheral unit.

In this manner, the conductive layer of the internal surface of the peripheral unit or the conductive resin of the peripheral unit allows electrostatic coupling capacity between input and output of the surface acoustic wave elements to be dispersed and reduced and the attenuation volume of the surface acoustic wave device to be increased in the attenuation band.

Also, in JP-A-188672/1994 was illustrated the example of fitting the resin base, into which the lead frame was pre-molded, and a cap, which protects the surface of the chip mounted on the lead frame in midair, to bond the fitted fringe with resin.

Also, either of the devices illustrated in JP-A63495/1993 and JP-A-188672/1994, has a SIP (Single In-line Package) structure.

In the surface acoustic wave device disclosed in JP-A63495/1993, however, a third problem exists: it is necessary to cover with an insulating film from the inside of the device the periphery of the peripheral unit of which the internal surface is a conductive layer, or of the lead wire that is caused to pass through the peripheral unit that is formed of the conductive resin, whereby the production process increases and low pricing of the surface acoustic wave device is difficult.

Further, in the SIP-shape surface acoustic wave device disclosed in JP-A-63495/1993 and JP-A-188672/1994, a fourth problem exists: This is inclined when mounted on a printed circuit board, stress such as distortion of the printed circuit board and so forth has an influence over characteristics of the surface acoustic wave device, or unification of the surface-mounting surface acoustic wave device using the conventional ceramic package and the printed circuit board is impossible, whereby the specific printed circuit board becomes necessary.

Namely, this is because, in the above-mentioned surface acoustic wave device of which the structure is SIP-shaped, pins concentrates at one side.

Further, in the SIP-shape surface acoustic wave device disclosed in JP-A-63495/1993 and JP-A-188672/1994, in order to support the chip comprising the piezoelectric substrate, it was illustrated that it was fastened to and mounted on the lead frame; however a fifth problem exists that it is not suitable for downsizing.

Namely, this is because, since the lead frame for mounting the chip has much area than the area of the chip, the outer dimension of the surface acoustic wave device gets constrained by the area of the said lead frame for mounting the chip.

SUMMARY OF THE INVENTION

The present invention is made to solve the above-mentioned problems.

An object of the present invention is to provide the low-priced surface acoustic wave device that increases the attenuation volume in the high-frequency attenuation band, realizes downsizing and weight reduction, and improves production efficiency.

In order to solve the above-mentioned tasks, the present invention provides the surface acoustic wave device including a lead frame made of metal in which a plurality of inner leads are formed, wherein a chip comprising at least one piezoelectric substrate is mounted on a resin base into which said lead frame is molded integrally, said surface acoustic wave device comprising: a wire lead section metal surface that is formed by exposing a wire lead section, which is electrically connected with an electrode of said chip through a bonding wire, out of said inner leads that are arranged on both sides of said chip, from said resin base; and a chip lead section metal surface that is formed by exposing a chip lead section, which is partially covered with said chip, out of said inner leads, from said resin base.

Since, by this means, it became possible to disperse and decrease electrostatic coupling capacity between the patterns of the input and the output elements formed on the chip, the attenuation volume is improved drastically in the high-frequency attenuation band.

Further, since the area of the chip lead section metal surface of the chip lead section is small as compared with that of the chip, by narrowing the space between the wire lead sections arranged oppositely, it becomes possible to realize the downsizing and weight reduction of the surface acoustic wave device.

Further, since a plurality of inner leads were adapted to be pre-formed in the lead frame to mount the chip on the resin base into which it was molded integrally, it became possible to intend shortening of the production process and reduction of the number of the components, whereby low pricing of the surface acoustic wave device can be realized.

The type thereof becomes a type of taking out the inner leads from both sides of the lead frame, whereby the surface acoustic wave device is not inclined when mounted on the printed circuit board, whereby stress such as deformation of the printed circuit board and so forth can be prevented from having an influence on the characteristics of the surface acoustic wave device.

Also, since the terminal space between the lead frames having a plurality of the terminals came to be able to be established flexibly, by designing at the same degree as the surface mounting pattern of the ceramic package, the surface acoustic wave device can be realized that can carry out unification of the ceramic package and the printed circuit board. For this reason, the specific printed circuit board, which has been used conventionally, becomes unnecessary.

Preferably, a hollow section is provided on the top face of said chip that is mounted on said resin base, and the resin cap is caused to join said resin base to cover said hollow section.

This means allows the chip, the bonding wire, and the wire lead section to be protected, while the predetermined purpose is realized.

Preferably, said inner lead is branched on the surface or in the inside of said resin base, the wire lead section metal surface for said wire lead section is provided for one side of said inner lead being branched, and the chip lead section metal surface for said chip lead section is provided for the other, more preferably, said inner lead associated with said chip lead section is branched on the surface or in the inside of aid resin base, and the wire lead section metal surface for use in said wire lead section is provided for said inner lead being branched, most preferably, a lead-out section, which is caused to reach said chip lead section in said wire lead section, is provided on the surface or in the inside of said resin base to extend said inner lead.

Since, by these means, the bonding wire plays a similar role to that of the branched inner lead, it becomes possible to play a role of increasing the degree of freedom of the connection of the bonding wire that electrically connects the chip and the wire lead section. For this reason, the electrostatic coupling capacity between the patterns of the input and the output is dispersed and reduced, and further improvement in the attenuation volume prospects well in the high-frequency attenuation band.

Preferably, said chip lead and said at least one wire lead section are connected electrically in the inside of the said resin base via the bonding wire.

Since, by this means, the bonding wire plays a similar role to that of the branched inner lead, it becomes possible to play a role of increasing the degree of freedom of the connection of the bonding wire that electrically connects the chip and the wire lead section. For this reason, the electrostatic coupling capacity between the patterns of the input and the output is dispersed and reduced, and further improvement in the attenuation volume prospects well in the high-frequency attenuation band.

Preferably, said branched or extended wire lead section and said wire lead section except this are connected electrically in the inside of the said resin base via the bonding wire.

Since, by this means, the bonding wire electrically connects the wire lead section and the wire lead section, it becomes possible to increase the degree of freedom of the connection of the bonding wire that electrically connects the chip and the wire lead section. For this reason, the electrostatic coupling capacity between the patterns of the input and the output is dispersed and reduced, and further improvement in the attenuation volume prospects well in the high-frequency attenuation band.

Preferably, said two chip lead sections are provided for said one chip, a given space is taken between the chip lead section metal surfaces for each of said chip lead sections, and each of said chip lead section metal surface is provided for one side of said branched inner lead and the wire lead section metal surface for said wire lead section is provided for the other.

By this means, it becomes possible to increase the degree of freedom of the connection of the bonding wire. For this reason, the electrostatic coupling capacity between the patterns of the input and the output is dispersed and reduced, and further improvement in the attenuation volume prospects well in the high-frequency attenuation band.

Preferably, said two chip lead sections are provided for said one chip, a given space is taken between the chip lead section metal surfaces for each of said chip lead sections, and the inner leads of said two chip lead section are arranged on different both sides from both sides in which the inner leads of said wire lead section are arranged.

By this means, it becomes possible to increase the degree of freedom of the connection of the bonding wire. For this reason, the electrostatic coupling capacity between the patterns of the input and the output is dispersed and reduced, and further improvement in the attenuation volume prospects well in the high-frequency attenuation band. Further, it becomes possible to take out the inner leads from 4 peripheries of the package of the surface acoustic wave device.

Preferably, each of said two chip leads and said wire lead section are connected electrically in the inside of the said resin base via the bonding wire.

By this means, it becomes possible to increase the degree of freedom of the connection of the bonding wire. For this reason, the electrostatic coupling capacity between the patterns of the input and the output is dispersed and reduced, and further improvement in the attenuation volume prospects well in the high-frequency attenuation band. Further, it becomes possible to take out the inner leads from 4 peripheries of the package of the surface acoustic wave device.

Preferably, electrical connection of said wire lead section and an electrode of said chip is made by use of golden balls by a flip chip technique.

By this means, the similar operational advantage to that of the bonding wire can be obtained.

Further, the present invention provides the manufacturing method of the surface acoustic wave device including a lead frame made of metal in which a plurality of inner leads are formed, wherein a chip comprising at least one piezoelectric substrate is mounted on a resin base into which said lead frame is molded integrally, said manufacturing method comprising the steps of: exposing a wire lead section, which is electrically connected with an electrode of said chip through a bonding wire, out of said inner leads that are arranged on both sides of said chip, from said resin base to form a wire lead section metal surface; and exposing a chip lead section, which is partially covered with said chip, out of said inner leads, from said resin base to form a chip lead section metal surface.

By this means, in a similar way to the above-mentioned invention, it becomes possible to increase the attenuation volume in the high-frequency attenuation band, to realize the downsizing and weight reduction, to improve the production efficiency and to realize the low pricing.

BRIEF DESCRIPTION OF THE DRAWINGS

This and other objects, features and advantages of the present invention will become more apparent upon a reading of the following detailed description and drawings, in which:

FIG. 1(*b*) is a top perspective view illustrating a first example associated with a package structure of a surface acoustic wave device relating to the present invention;

FIG. 2(*b*) is a view illustrating characteristics of the surface acoustic wave device in which exists the metal pattern by the wire lead section metal surface 7*a* and the chip lead section metal surface 10*a* in accordance with the present invention;

FIG. 3(*b*) is a top perspective view illustrating a second example associated with a package structure of a surface acoustic wave device relating to the present invention;

FIG. 4(*b*) is a top perspective view illustrating a third example associated with a package structure of a surface acoustic wave device relating to the present invention;

FIG. 5(*b*) is a top perspective view illustrating a fourth example associated with a package structure of a surface acoustic wave device relating to the present invention;

FIG. 6(*b*) is a top perspective view illustrating a fifth example associated with a package structure of a surface acoustic wave device relating to the present invention;

FIG. 7(*b*) is a top perspective view illustrating a sixth example associated with a package structure of a surface acoustic wave device relating to the present invention;

FIG. 8(*b*) is a top perspective view illustrating a seventh example associated with a package structure of a surface acoustic wave device relating to the present invention.

FIG. 9(*b*) is a top perspective view illustrating an eighth example associated with a package structure of a surface acoustic wave device relating to the present invention;

FIG. 10(*b*) is a top perspective view illustrating a ninth example associated with a package structure of a surface acoustic wave device relating to the present invention;

DESCRIPTION OF THE EMBODIMENTS

Hereinafter, embodiments of the present invention will be explained based on examples in reference to the accompanied drawings.

Figure 1:
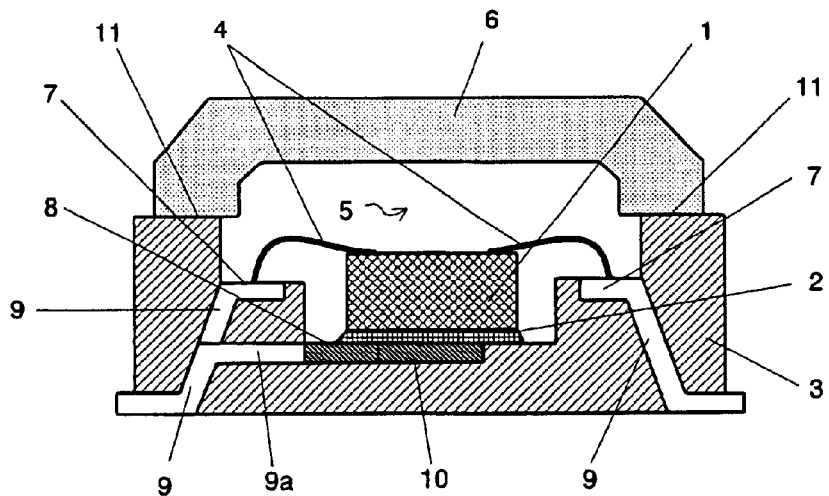
FIG. 1(*a*) is a side perspective view illustrating a first example associated with a package structure of a surface acoustic wave device relating to the present invention.
Figure 1:
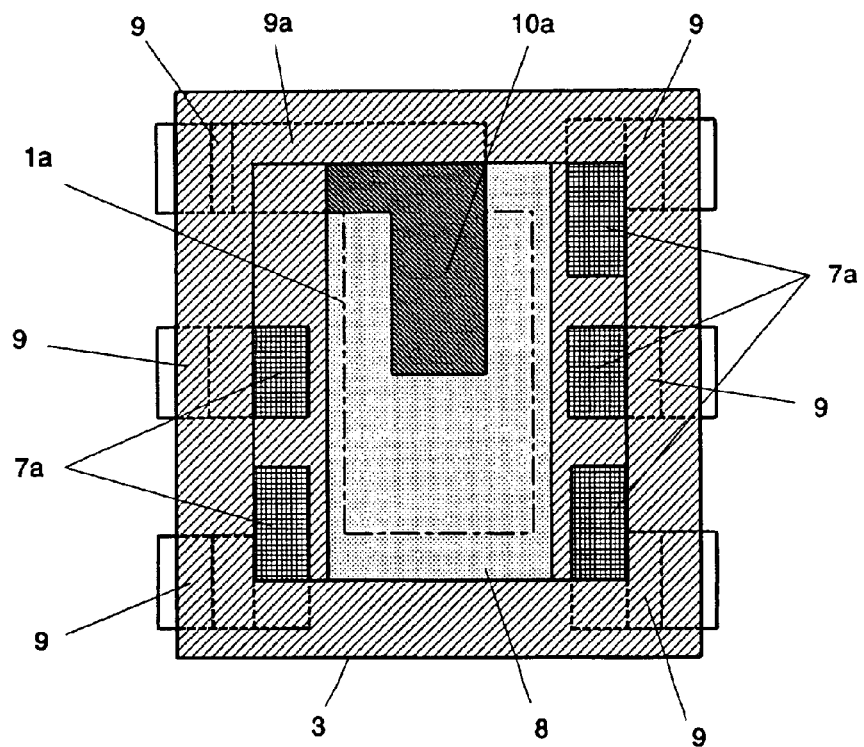

FIG. 1 is a side perspective view (a) and a top perspective view (b) illustrating a first example associated with a package structure of a surface acoustic wave device relating to the present invention. Additionally, (b) in FIG. 1 is a view before a chip, bonding wires, and a resin cap are mounted.

The package of the surface acoustic wave device relating to the first example of the present invention includes a lead frame that is not shown. The lead frame, which consists of Fe—Cu alloy and so forth, includes a plurality of terminals. As shown in this FIGS. 1(*a*) and (*b*), in the lead frame, a plurality of inner leads 9 are pre-formed on the both sides thereof in response to a plurality of the terminals, and further, a resin base 3 is integrally molded into the lead frame with pre-molding.

Chips 1 of the surface acoustic wave device comprising the piezoelectric substrate are fastened to the resin base 3 by use of a mounting adhesive 2, at least one of which is mounted.

The inner lead 9 with a predetermined dimension is formed of the Fe—Cu alloy and so forth in a similar manner to the lead frame, and includes a wire lead section 7 at one end of the inside thereof.

Additionally, the wire lead section 7 of the inner lead 9 includes a wire lead section metal surface 7*a* with a predetermined area exposed from the resin base 3

The chip 1 is mounted on a chip outline 1*a* of a chip mounting face 8 of the resin base 3, a chip lead section 10 is provided for a part of the chip mounting face 8, and the chip lead section 10 includes a chip lead section surface 10*a* with a predetermined area exposed from the resin base 3.

The chip lead section 10 is caused to be in continuity with the back of a part of the chip 1 being mounted. Additionally, a metal film is formed on the back of the chip 1.

Further, an inner lead lead-in section 9a is provided between at least one inner lead 9 and the chip lead section 10 in stead of the above-mentioned wire lead section 7, and the inner lead lead-in section 9a leads the inner lead 9 to the chip lead section 10.

Furthermore, the chip 1 and the wire lead section 7 are connected electrically through the bonding wire 4.

A hollow section 5 is provided over the top face of the chip 1, and the hollow section 5 is the space for protecting the chip 1, the bonding wire 4, and the wire lead section 7 from contacting the other.

Further, the hollow section 5 is covered with the resin cap 6, and the resin base 3 and the resin cap 6 are joined at a joint surface 11 to form the surface acoustic wave device.

Next, the manufacturing method of the first example will be described.

For the lead frame having the inner leads 9 that are a plurality of terminals, as mentioned above, the material of Cu—Fe alloy is employed; however, in addition hereto, the material such as Fe—Ni alloy and so forth, which is normally used for semiconductor devices, may be employed.

In the lead frame, a plurality of the inner leads 9 are formed of one-piece plate through a die drawing process and a bending process, and arranged on both sides thereof.

At least one inner lead 9 for the chip lead section 10 out of a plurality of the inner leads 9 that are formed on the lead frame, and a plurality of the inner leads 9 for the wire lead section 7 are provided, and on the basis of the bottom base of the resin base 3, the inner lead 9 is formed so that each of the wire lead section 7 and the chip lead section 10 reaches a predetermined height.

As to the wire lead section 7, the inner lead 9 is formed so that the opposite space of wire lead sections 7 reaches a predetermined height at a predetermined space.

As to the chip lead section 10, since the concave portion on which the chip 1 is mounted is provided on the resin base 3, the chip lead section 10 differs in the predetermined height from the wire lead section 7. For this reason, the predetermined height of the inner lead lead-in section 9a of the inner lead 9 is different from that of the wire lead section 7 of the inner lead 9.

Next, in order to obtain the resin base 3, by use of a die that is shaped for embedding the inner lead 9 formed in the lead frame, the integral molding is carried out with the pre-mold.

At this moment, in order to obtain the wire lead section metal surface 7a and the chip lead section metal surface 10a, the dimension is designed so that the wire lead section 7 and the chip lead 10 are exposed from the top face of the resin base 3.

In this case, as resin mold materials, thermosetting resin like epoxy resin and thermoplastic resin like polyphenylene sulfide resin are usable.

Next, the chip 1 (surface acoustic wave element) having a tandem-compound aluminum electrode pattern arranged on the piezoelectric substrate is fastened to the chip mounting face 8 of the resin base 3 with the mounting adhesive 2.

As the piezoelectric material of the chip 1, a crystal substrate is employed; however, depending upon application, as the piezoelectric material, a lithium niobate substrate and a lithium tantalate substrate may be employed.

Additionally, as the electrode material of the chip 1, aluminum is employed; however the material such as Al—Cu alloy and so forth can be employed.

A silver paste is employed for the mounting adhesive 2, and continuity between the chip lead section surface 10a of the chip lead section 10 and a part of the chip 1 is taken. If the metal film such as titanium, chrome and so forth is pre-formed on the back of the chip 1, the continuity is more easily taken.

In addition hereto, adhesives of silicon series, adhesives of epoxy series and so forth can be employed for the mounting adhesive 2.

Next, as the bonding wire 4 that electrically connects the chip 1 and the wire lead section metal surface 7a of the wire lead section 7, the material such as gold, aluminum and so forth are used.

Next, as the material of the resin cap 6 that covers the hollow section 5 that protects the wire lead section 7, are employed the same thermosetting resin like the epoxy resin and the same thermoplastic resin like the polyphenylene sulfide resin as the resin mold material which are employed for pre-formation of the resin base 3.

The resin cap 6 is formed bit by bit, predetermined length by predetermined length, and in a longitudinal and transverse direction to the outline of the resin base 3.

The resin base 3 and the resin cap 6 are joined at the joint surface 11. For joining the resin base 3 and the resin cap 6, the thermosetting resin is employed in order to keep air-tightness of the package.

Next, the resin base 3 is cut out from the lead frame with a predetermined length left from the end face thereof.

Figure 2:
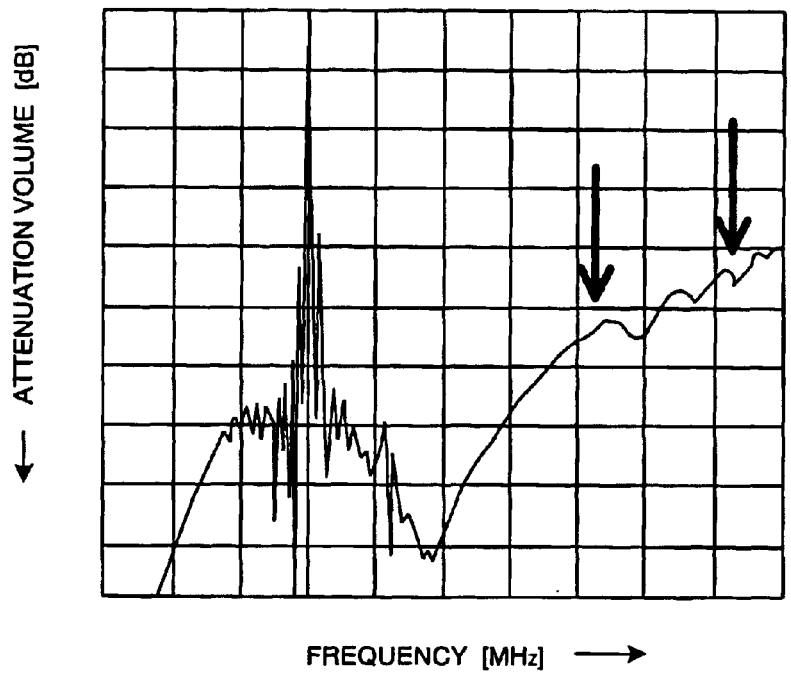
FIG. 2(*a*) is a view illustrating characteristics of the surface acoustic wave device in which no metal pattern exists.
Figure 2:
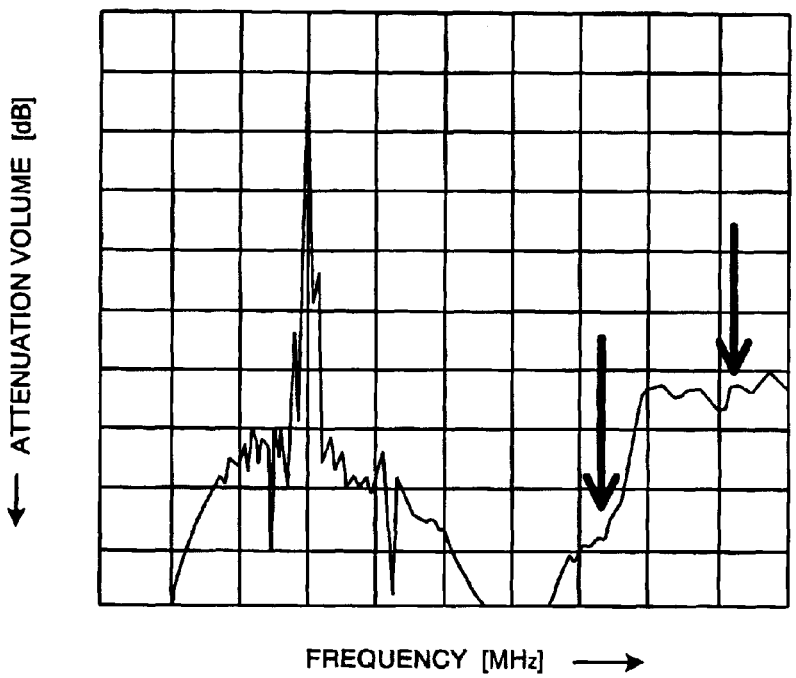

FIG. 2 is a view illustrating a comparison between characteristics (a) of the surface acoustic wave device in which no conventional metal pattern exists, and characteristics (b) of the surface acoustic wave device in which exists the metal pattern by the wire lead section metal surface 7a and the chip lead section metal surface 10a in accordance with the present invention.

As shown in this Fig (a) and (b), in accordance with the first example of the present invention, the attenuation volume is improved remarkably in the high-frequency attenuation band.

Namely, this is because, by arranging so that the wire lead section metal surface 7a of the wire lead section 7 associated with a plurality of the inner leads 9 is exposed on the face of the resin base 3 in which the chip 1 is mounted, and yet so that the chip lead section metal surface 10a of the chip lead section 10 associated with at least one inner lead 9 is exposed on the face of the resin base 3 and a part thereof is covered with the chip 1, it became possible to disperse and reduce the electrostatic coupling capacity between the patterns of the input and the output elements formed on the chip 1.

Further, in accordance with the first example of the present invention, since the area of the chip lead section metal surface 10a of the chip lead section 10 is small as compared with that of the chip 1, it becomes possible to narrow the space between the wire lead sections arranged oppositely to realize the downsizing and weight reduction of the surface acoustic wave device.

Namely, the lead frame is formed of one-piece plate through the die drawing process and the bending process. If the area of the chip lead section 10 is large as compared with that of the chip 1, the space between the wire lead sections, which are arranged oppositely, is primarily decided due to a dimension of the chip lead section 10. The reason is that, to the contrary, if the area of the chip lead section metal surface 10a is small as compared with that of the chip 1, it becomes possible to narrow the cap between the wire lead sections 7 that are arranged oppositely.

Further, in accordance with the first example of the present invention, it becomes possible to realize the low pricing of the surface acoustic wave device.

Namely, since a plurality of the inner leads 9 were adapted to be pre-formed in the lead frame to mount the chip 1 on the resin base 3 into which it was molded integrally, it became possible to intend shortening of the production process and reduction of the number of the components.

Additionally, the electrical connection of the chip 1 on the resin base 3 obtained in such a manner and the external terminal is easily realized with the bonding wire 4, and yet protection of the chip 1, the bonding wires 4 and so forth is easily realized by the hollow section 5 and the resin cap 6.

Further, in accordance with the first example of the present invention, the type thereof becomes a periphery-lead type of taking out the inner leads 9 from both sides of the lead frame, differently from the conventional SIP type, whereby the surface acoustic wave device is not inclined when mounted on the printed circuit board, whereby it became possible to prevent an influence of stress such as deformation of the printed circuit board and so forth over the characteristics of the surface acoustic wave device.

Also, since the terminal space between the lead frames having a plurality of the terminals came to able to be established flexibly, by designing at the same degree as the surface mounting pattern of the ceramic package, the surface acoustic wave device can be realized that can carry out unification of the ceramic package and the printed circuit board. For this reason, the specific printed circuit board, which was used conventionally, becomes unnecessary.

Figure 3:
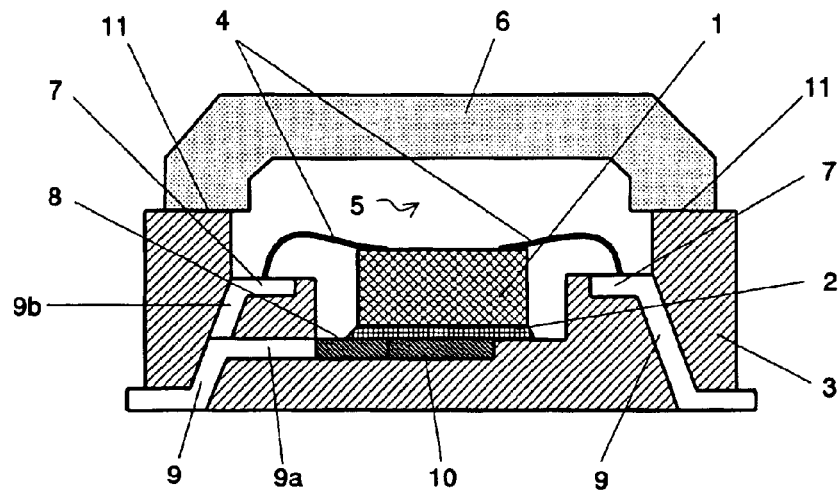
FIG. 3(*a*) is a side perspective view illustrating a second example associated with a package structure of a surface acoustic wave device relating to the present invention.
Figure 3:
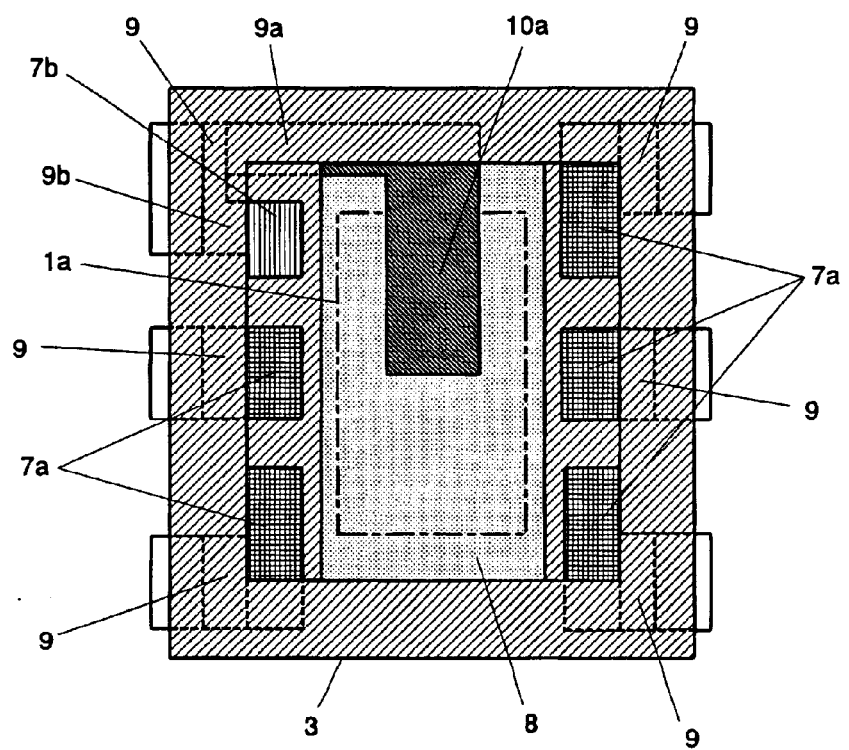

FIG. 3 is a side perspective view (a) and a top perspective view (b) illustrating a second example associated with a package structure of a surface acoustic wave device relating to the present invention. Additionally, (b) in FIG. 3, for simplification of explanation, is a view before a chip, bonding wires, and a resin cap of FIG. 3(*a*) are mounted. As shown in this Fig (a) and (b), as compared with FIGS. 1(*a*) and (*b*), in the package structure of the surface acoustic wave device relating to the second example of the present invention, as to the inner lead 9 of the chip lead section 10, the inner lead 9 of the chip lead section 10 is adapted to be formed so that it is branched on the surface of the resin base 3 or in the inside of the resin base 3, one side is caused to pass through the inner lead lead-in section 9a to form the chip lead section 10 and the other is caused to pass through the inner lead lead-in section 9b to form the wire lead section 7.

Additionally, the wire lead section 7, which is formed through the inner lead lead-in section 9b, includes a wire lead section surface 7b with a predetermined area exposed from the resin base 3.

In this case, in a similar manner to the first example, needless to say, the inner leads 9 including the wire lead section 7 and the chip lead section 10 are formed so that, on the basis of the bottom base of the resin base 3, each of the wire lead section 7 and the chip lead section 10 reaches a predetermined height, and yet so that the space between the opposite wire lead sections 7 reaches a predetermined space.

The inner lead 9, which is formed in this manner, is used. The other than the structure of the lead frame is similar to that of the first example.

Accordingly, in accordance with the second example of the present invention, it becomes possible that the bonding wire 4, which electrically connects the chip 1 and the wire lead section 7, plays a role of increasing the degree of freedom of the connection thereof. For this reason, the electrostatic coupling capacity between the patterns of the input and the output is dispersed and reduced, and further improvement in the attenuation volume prospects well in the high-frequency attenuation band.

Figure 4:
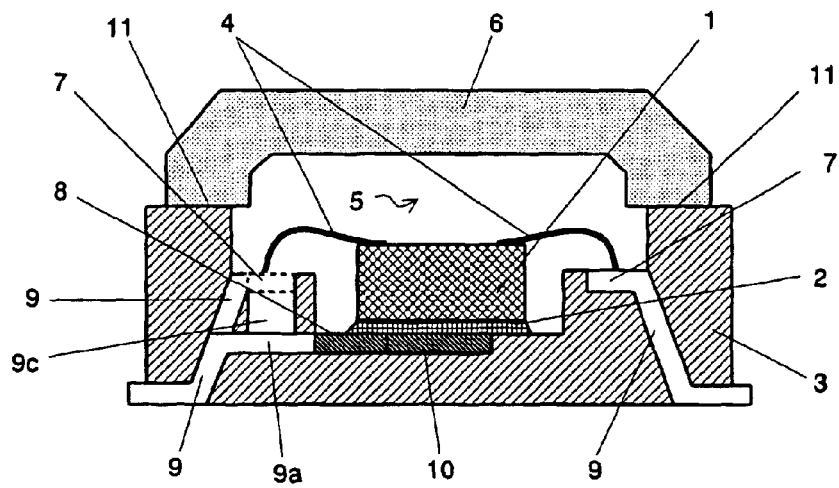
FIG. 4(*a*) is a side perspective view illustrating a third example associated with a package structure of a surface acoustic wave device relating to the present invention.
Figure 4:
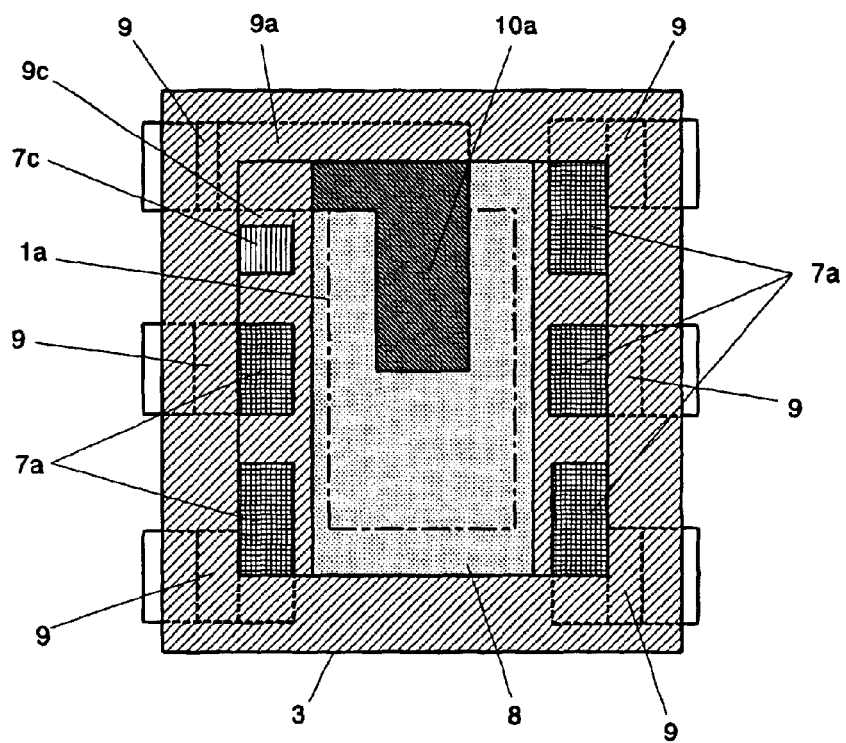

FIG. 4 is a side perspective view (a) and a top perspective view (b) illustrating a third example associated with a package structure of a surface acoustic wave device relating to the present invention. Additionally, (b) in FIG. 4, for simplification of explanation, is a view before a chip, bonding wires, and a resin cap of FIG. 4(*a*) are mounted.

As shown in this Fig (a) and (b), as compared with FIGS. 1(*a*) and (*b*), in the package structure of the surface acoustic wave device relating to the third example of the present invention, as to the inner lead 9 of the chip lead section 10, the inner lead 9 of the chip lead section 10 is adapted to be formed so that an inner lead lead-in section 9c is branched halfway the inner lead lead-in section 9a in the inside of the resin base 3, one side is caused to pass through the inner lead lead-in section 9a to form the chip lead section 10 and the other is caused to pass through the inner lead lead-in section 9c to form the wire lead section 7.

Additionally, the wire lead section 7, which is formed through the inner lead lead-in section 9c, includes a wire lead section surface 7c with a predetermined area exposed from the resin base 3.

The inner lead, which is formed in this manner, is used. The other than the structure of the lead frame is similar to that of the first example.

Accordingly, in accordance with the third example of the present invention, it becomes possible that the bonding wire 4, which electrically connects the chip 1 and the wire lead section 7, plays a role of increasing the degree of freedom of the connection thereof. For this reason, the electrostatic coupling capacity between the patterns of the input and the output is dispersed and reduced, and further improvement in the attenuation volume prospects well in the high-frequency attenuation band.

Figure 5:
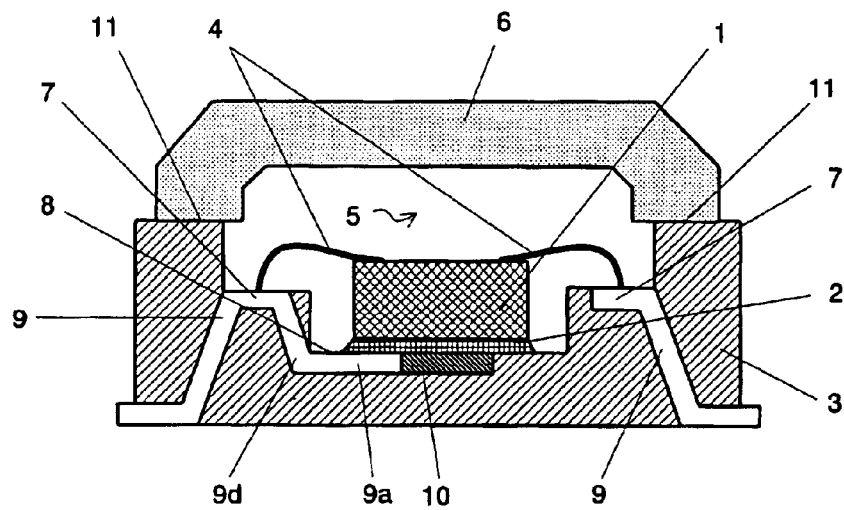
FIG. 5(*a*) is a side perspective view illustrating a fourth example associated with a package structure of a surface acoustic wave device relating to the present invention.
Figure 5:
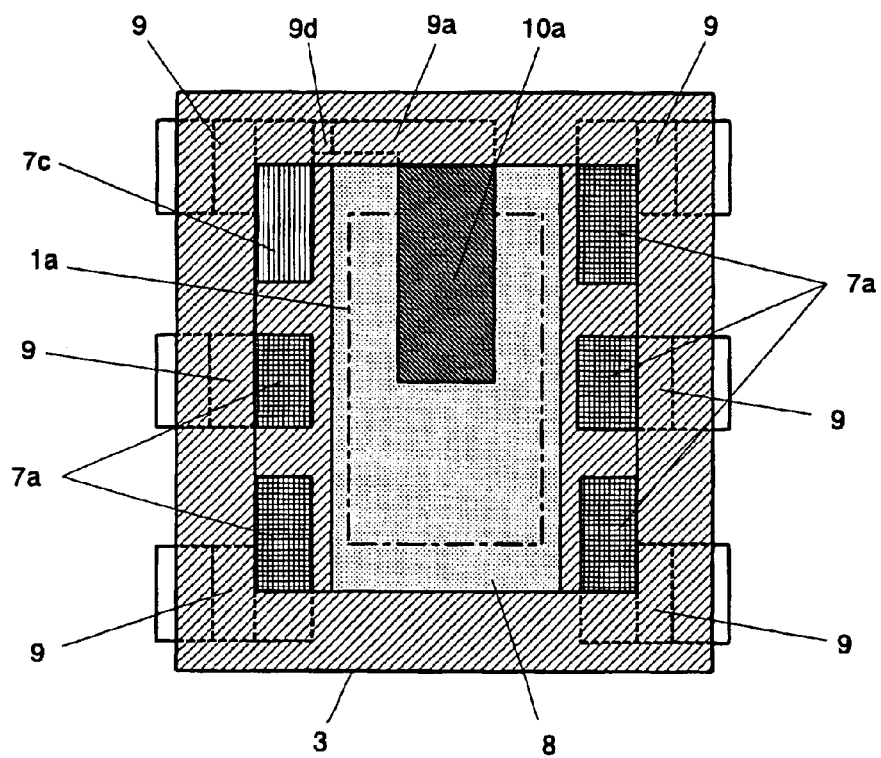

FIG. 5 is a side perspective view (a) and a top perspective view (b) illustrating a fourth example associated with a package structure of a surface acoustic wave device relating to the present invention. Additionally, (b) in FIG. 5, for simplification of explanation, is a view before a chip, bonding wires, and a resin cap of FIG. 5(*a*) are mounted.

As shown in this Fig (a) and (b), as compared with FIGS. 1(*a*) and (*b*), in the package structure of the surface acoustic wave device relating to the fourth example of the present invention, as to the inner lead 9 of the chip lead section 10, the inner lead 9 of the chip lead section 10 is adapted to be formed so that the wire lead section 7 is formed once, the inner lead 9 formed in the inside of the resin base 3 at the same height as that of the wire lead section 7 is extended by an inner lead lead-in section 9d and the inner lead lead-in section 9d is caused to pass through the inner lead lead-in section 9a to form the chip lead section 10.

The wire lead section 7 formed once includes a wire lead section surface 7d with a predetermined area exposed from the resin base 3.

The inner lead, which is formed in this manner, is used. The other than the structure of the lead frame is similar to that of the first example.

Accordingly, in accordance with the fourth example of the present invention, it becomes possible that the bonding wire 4, which electrically connects the chip 1 and the wire lead section 7, plays a role of increasing the degree of freedom of the connection thereof. For this reason, the electrostatic coupling capacity between the patterns of the input and the output is dispersed and reduced, and further improvement in the attenuation volume prospects well in the high-frequency attenuation band.

Figure 6:
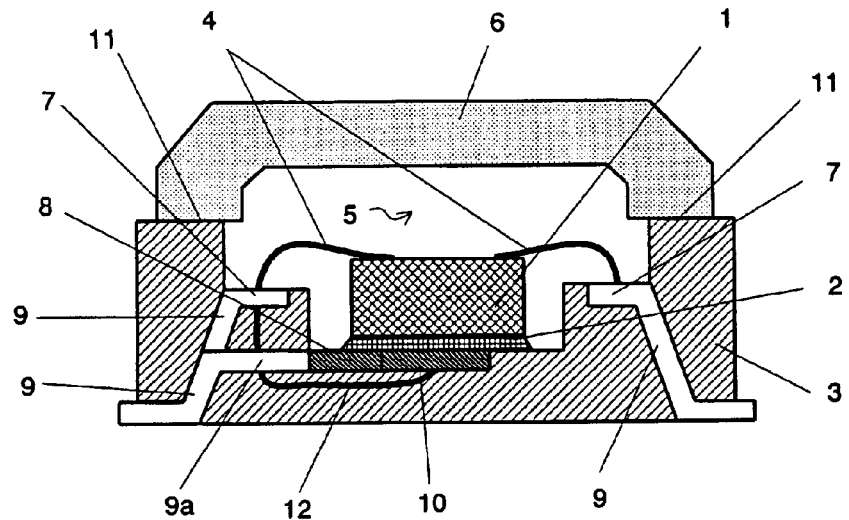
FIG. 6(*a*) is a side perspective view illustrating a fifth example associated with a package structure of a surface acoustic wave device relating to the present invention.
Figure 6:
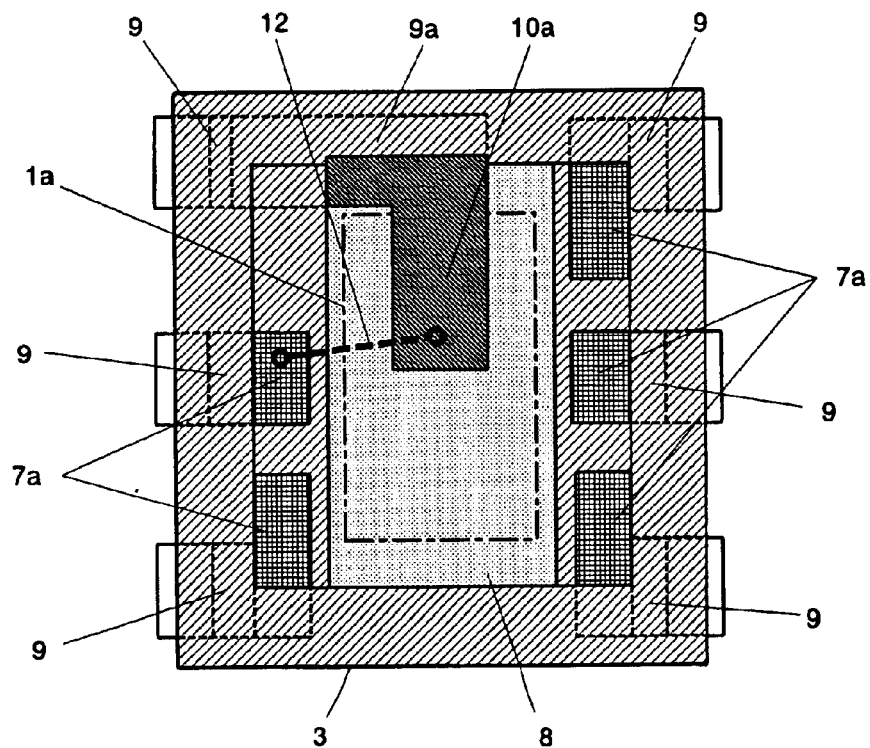

FIG. 6 is a side perspective view (a) and a top perspective view (b) illustrating a fifth example associated with a package structure of a surface acoustic wave device relating to the present invention. Additionally, (b) in FIG. 6, for simplification of explanation, is a view before a chip, bonding wires, and a resin cap of FIG. 6(a) are mounted.

As shown in this Fig (a) and (b), as compared with FIGS. 1(a) and (b), in the package structure of the surface acoustic wave device relating to the fifth example of the present invention, the inner lead, which is formed in a similar manner to the first example, is used, and the chip lead section metal surface 10a for the chip lead section 10 and at least one wire lead section metal surface 7a of the wire lead section 7 are electrically connected through a bonding wire 12.

Thereafter, the integrated molding is carried out with the pre-mold by use of the die to obtain the resin base 3.

The other than the structure, in which the bonding wire 12 in the inside of the resin base 3 is added, is similar to that of the first example.

Accordingly, in accordance with the fifth example of the present invention, since the bonding wire 12 plays a similar role to the inner lead 9 branched in the second to fourth examples, it becomes possible to increase the degree of freedom of the connection of the bonding wire, which electrically connects the chip 1 and the wire lead section 7. For this reason, the electrostatic coupling capacity between the patterns of the input and the output is dispersed and reduced, and further improvement in the attenuation volume prospects well in the high-frequency attenuation band.

Figure 7:
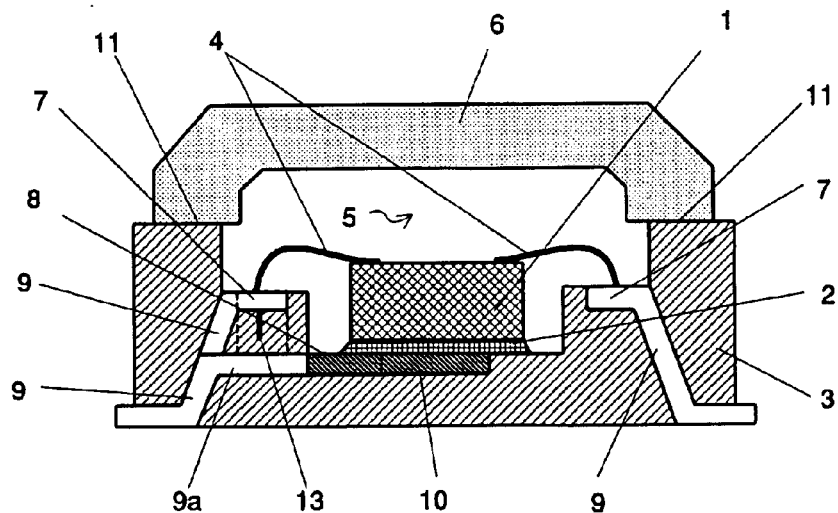
FIG. 7(*a*) is a side perspective view illustrating a sixth example associated with a package structure of a surface acoustic wave device relating to the present invention.
Figure 7:
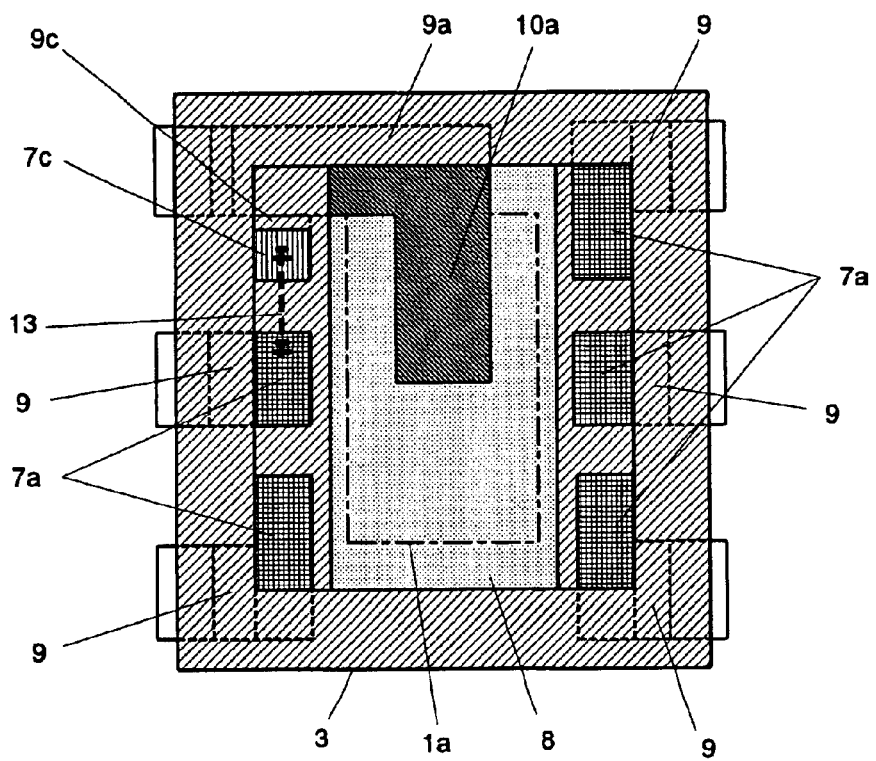

FIG. 7 is a side perspective view (a) and a top perspective view (b) illustrating a sixth associated with a package structure of a surface acoustic wave device relating to the present invention. Additionally, (b) in FIG. 7, for simplification of explanation, is a view before a chip, bonding wires, and a resin cap of FIG. 7(a) are mounted.

As shown in this Fig (a) and (b), as compared with FIGS. 4(a) and (b), in the sixth example of the present invention, the inner lead formed in a similar manner to the third example is used, and the wire lead section 7 and at least another wire lead section 7 are electrically connected with a bonding wire 13 through the inner lead lead-in section 9c.

Thereafter, the integrated molding is carried out with the pre-mold by use of the die to obtain the resin base 3.

The other than the structure, in which the bonding wire 13 of the inside of the resin base 3 is added, is similar to that of the third example.

Accordingly, in accordance with the sixth example of the present invention, it becomes possible for the bonding wire 13 to increase the degree of freedom of the connection of the bonding wire that makes the electrical connection between the wire lead sections 7. For this reason, the electrostatic coupling capacity between the patterns of the input and the output is dispersed and reduced, and further improvement in the attenuation volume prospects well in the high-frequency attenuation band.

Figure 8:
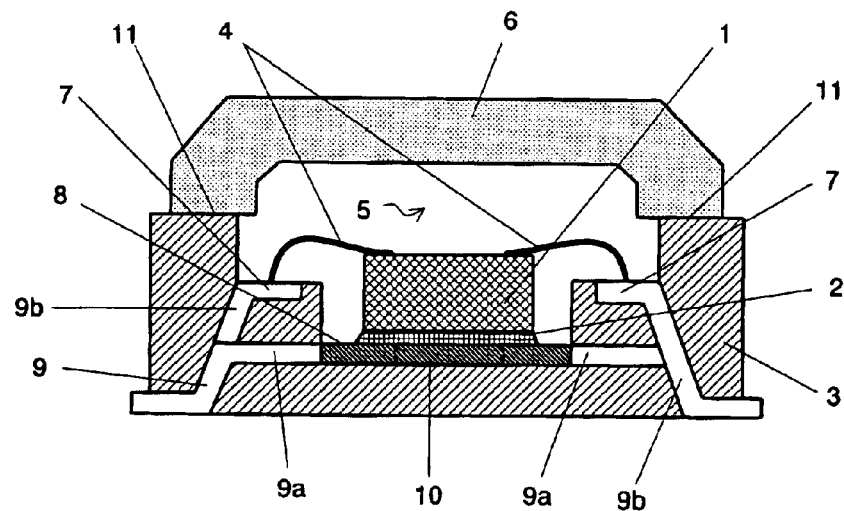
FIG. 8(*a*) is a side perspective view illustrating a seventh example associated with a package structure of a surface acoustic wave device relating to the present invention.
Figure 8:
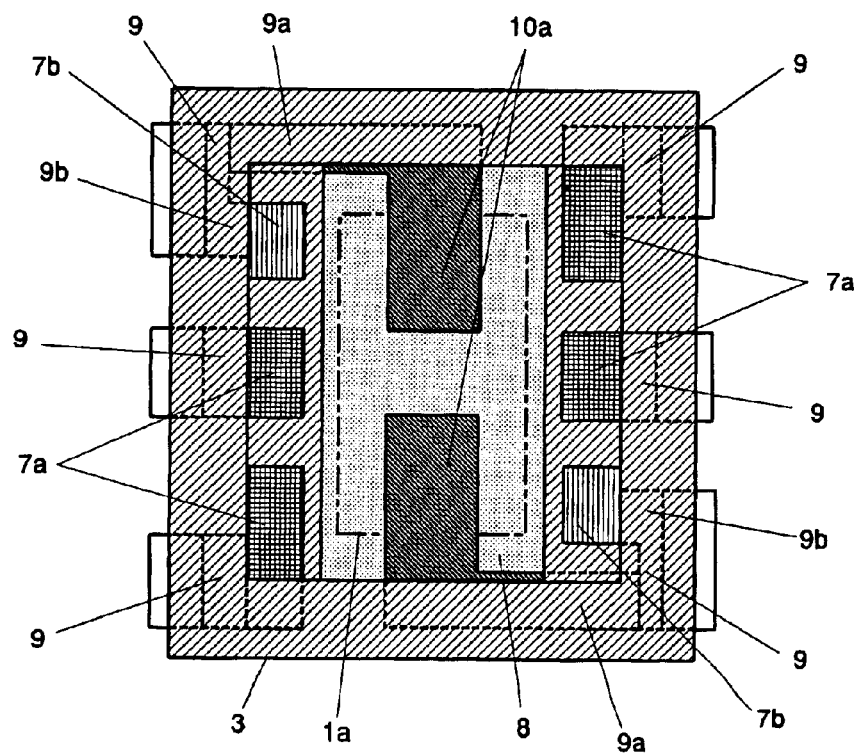

FIG. 8 is a side perspective view (a) and a top perspective view (b) illustrating a seventh example associated with a package structure of a surface acoustic wave device relating to the present invention. Additionally, (b) in FIG. 8, for simplification of explanation, is a view before a chip, bonding wires, and a resin cap of FIG. 8(a) are mounted.

As shown in this Fig (a) and (b), as compared with FIGS. 1(a) and (b), in the package structure of the surface acoustic wave device relating to the seventh example of the present invention, the two chip lead sections 10 are provided within the chip outline 1a of the chip mounting face 8, and the two chip lead sections 10 are spaced a predetermined distance and arranged in a direction where a plurality of both sides' inner leads 9 are arrayed.

As to each inner lead 9 of the two chip lead sections 10, it is branched on the surface of the resin base 3 or in the inside of the resin base 3, a chip lead section metal surface 10a is provided for one side's inner lead 9a of the branched inner lead 9, and a wire lead section metal surface 7b for the wire lead section is provided for the other's inner lead 9b.

Additionally, each inner lead 9 of the above-mentioned two chip lead sections 10 may be provided for corners of a diagonal of the lead frame, or the same side's corners.

The inner lead 9, which is formed in this manner, is used. The other than the structure of the lead frame is similar to that of the first example.

Accordingly, in accordance with the seventh example of the present invention, it becomes possible to increase the degree of freedom of the connection of the bonding wire. For this reason, the electrostatic coupling capacity between the patterns of the input and the output is dispersed and reduced, and further improvement in the attenuation volume prospects well in the high-frequency attenuation.

Figure 9:
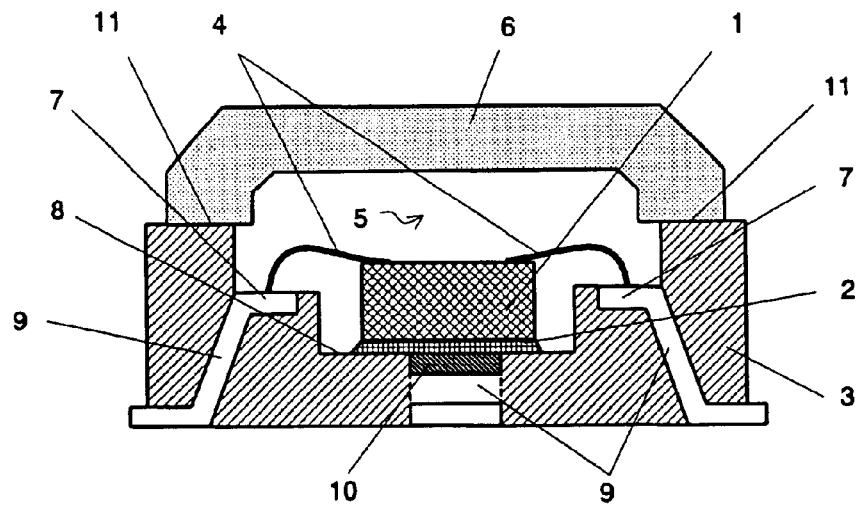
FIG. 9(*a*) is a side perspective view illustrating an eighth example associated with a package structure of a surface acoustic wave device relating to the present invention.
Figure 9:
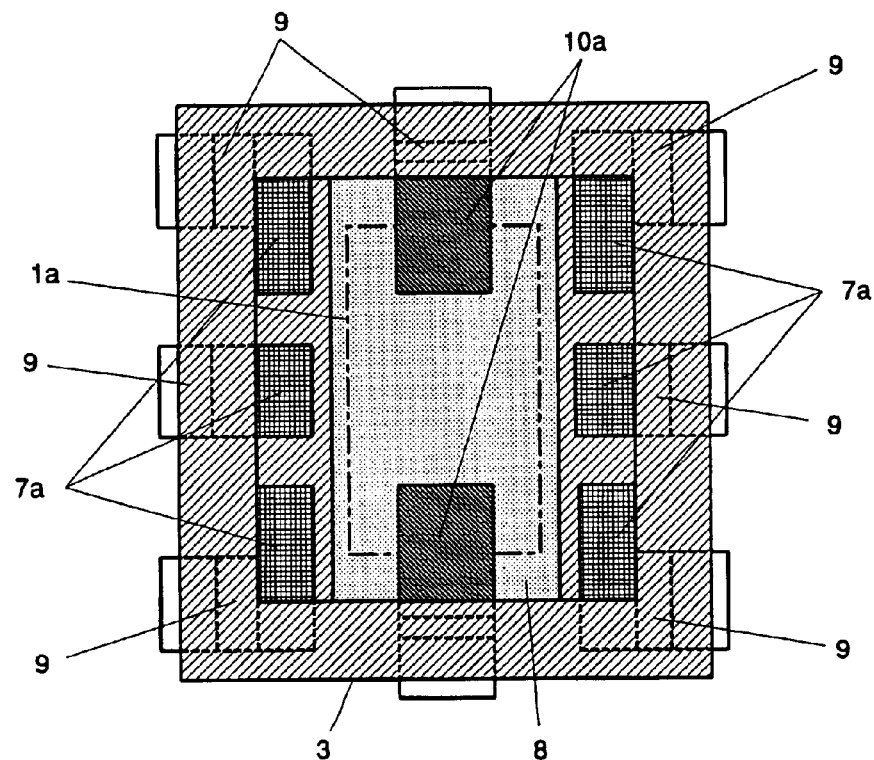

FIG. 9 is a side perspective view (a) and a top perspective view (b) illustrating an eighth example associated with a package structure of a surface acoustic wave device relating to the present invention. Additionally, (b) in FIG. 9, for simplification of explanation, is a view before a chip, bonding wires, and a resin cap of FIG. 9(a) are mounted.

As shown in this Fig (a) and (b), as compared with FIGS. 1(a) and (b), in the package structure of the surface acoustic wave device relating to the eighth example of the present invention, a plurality of the inner leads 9 are arrayed on both sides of the chip 1 and formed into the lead frame.

Additionally, the two chip lead sections 10 are provided within the chip outline 1a of the chip mounting face 8, and the two chip lead sections 10 are spaced a predetermined distance and arranged in a direction where a plurality of both sides' inner leads 9 are arrayed.

The two inner leads 9 associated with the two chip lead sections 10 are formed, and each of the two chip lead sections 10 includes the chip lead section metal surface 10a with a predetermined area exposed from the resin base 3.

The inner lead 9, which is formed in this manner, is used. The other than the structure of the lead frame is similar to that of the first example.

Accordingly, in accordance with the eighth example of the present invention, it becomes possible to increase the degree of freedom of the connection of the bonding wire. For this reason, the electrostatic coupling capacity between the patterns of the input and the output is dispersed and reduced, and further improvement in the attenuation volume prospects well in the high-frequency attenuation. Further, it becomes possible to take out the inner lead 9 from 4 peripheries of the package of the surface acoustic wave device.

Figure 10:
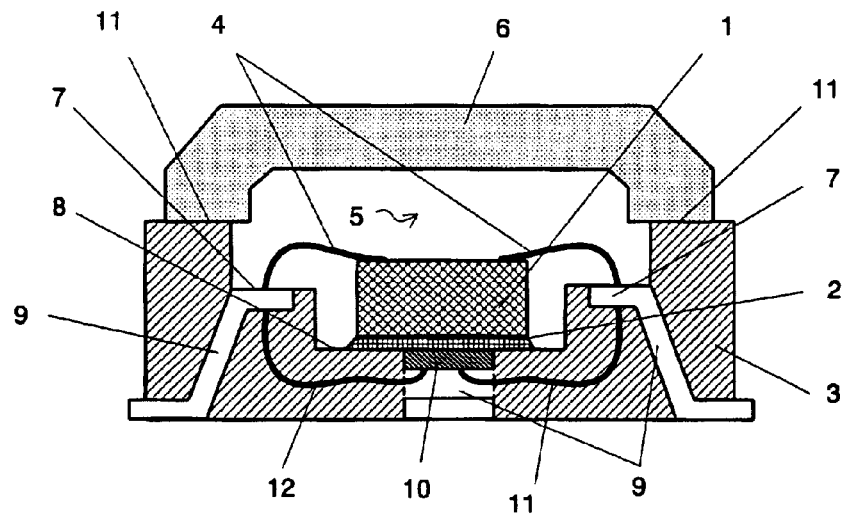
FIG. 10(*a*) is a side perspective view illustrating a ninth example associated with a package structure of a surface acoustic wave device relating to the present invention.
Figure 10:
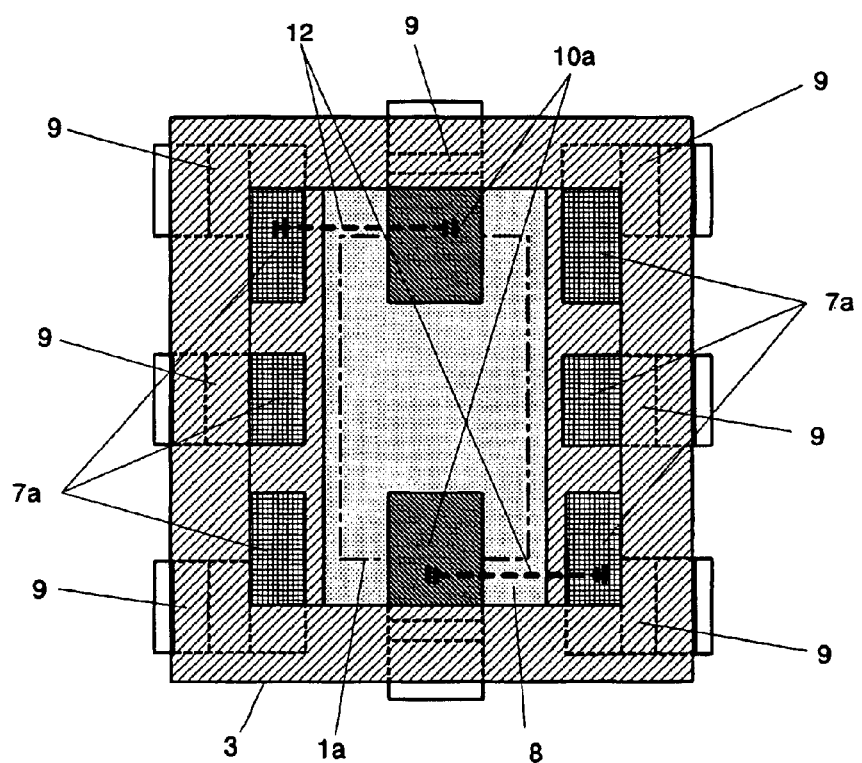
Figure 11:
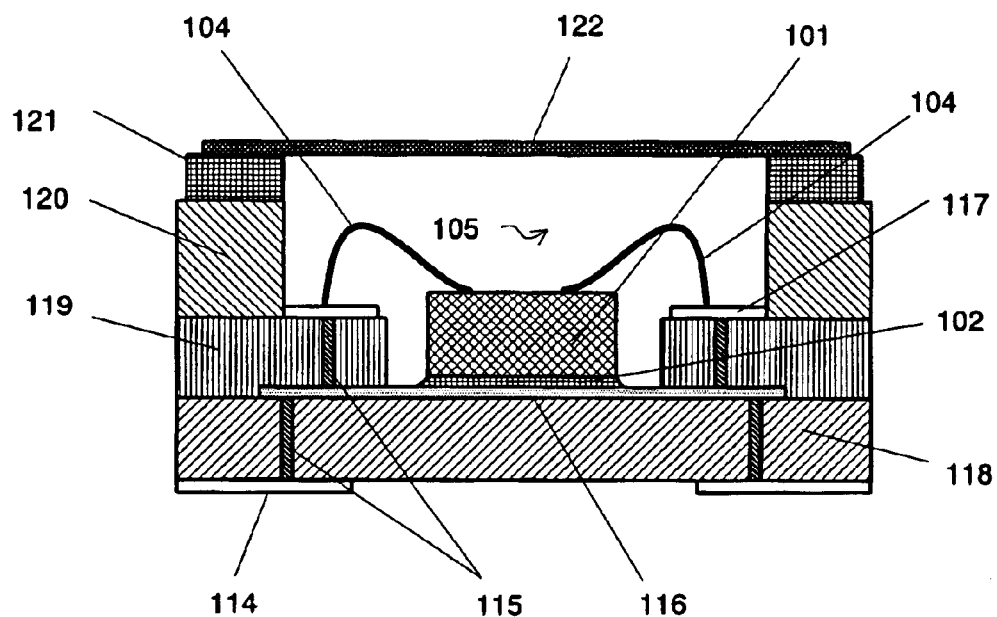
FIG. 11 is a view illustrating a section of the surface acoustic wave device using a conventional ceramic package.

FIG. 10 is a side perspective view (a) and a top perspective view (b) illustrating a ninth example associated with a package structure of a surface acoustic wave device relating to the present invention. Additionally, (b) in FIG. 10, for simplification of explanation, is a view before a chip, bonding wires, and a resin cap of FIG. 10(a) are mounted.

As shown in this Fig (a) and (b), the package of the surface acoustic wave device relating to the ninth example of the present invention is a modified example in which the eighth example of FIG. 9 and the fifth example of FIG. 6 were combined.

In the package of this surface acoustic wave device, the chip lead section metal surfaces 10a of the two chip lead sections 10 are electrically connected with the wire lead section metal surfaces 7a of the wire lead section 7 of the inner lead 9 that are positioned on the corners of the diagonal of the lead frame.

The inner lead 9, which is formed in this manner, is used. The other than the structure of the lead frame is similar to that of the first example.

Accordingly, in accordance with the ninth example of the present invention, it becomes possible to increase the degree of freedom of the connection of the bonding wire. For this reason, the electrostatic coupling capacity between the patterns of the input and the output is dispersed and reduced, and further improvement in the attenuation volume prospects well in the high-frequency attenuation.

Further, it becomes possible to take out the inner lead 9 from 4 peripheries of the package of the surface acoustic wave device.

Above, in the first to the ninth examples, the electrical connection of the external terminal of the chip 1 is carried out with the bonding wire 4, and the same effect is also obtained in the structure of making the electrical connection by the gold ball with the flip chip technique.

As explained above, in accordance with the present invention, by exposing the wire lead potion, which was electrically connected with the electrode of the chip through the bonding wire, out of the inner leads, which were arranged on both sides of the chip, from the resin base, the wire lead section metal surface was adapted to be formed, and by exposing the chip lead section, a part of which was covered with the chip, out of the inner lead, from the resin base, the chip lead section metal surface was adapted to be formed, whereby the attenuation volume can be increased in the high-frequency attenuation band, the downsizing and weight reduction can be realized, the production efficiency can be improved and it becomes possible to realize the low pricing.

What is claimed is:

1. A surface acoustic wave device, comprising:
a plurality of inner leads;
a chip comprising a piezoelectric substrate mounted on a resin base into which said plurality of inner leads are molded integrally;
a wire lead section metal surface formed by exposing a wire lead section, which is electrically connected with an electrode of said chip through a bonding wire, out of said plurality of inner leads that are arranged both sides of said chip, from said resin base; and
a chip lead section metal surface formed by exposing a chip lead section, which is partially covered with said chip, out of said plurality of inner leads, from said resin base.

2. The surface acoustic wave device according to claim 1, wherein a hollow section is provided on a top face of said chip mounted on said resin base, and wherein a resin cap joins said resin to cover said hollow section.

3. The surface acoustic wave device according to claim 1, wherein an inner lead of said plurality of inner leads is branched on a surface or in an inside of said resin base, wherein said wire lead section metal surface of said wire lead section is provided for on one side of said inner lead being branched, and wherein said chip lead section metal surface for said chip lead is provided for on another side of said inner lead.

4. The surface acoustic wave device according to claim 1, wherein said plurality of inner leads associated with said chip lead section is branched on a surface or in an inside of said resin base, and wherein said wire lead section metal surface, which is employed for said wire lead, is provide for said plurality of said inner leads being branched.

5. The surface acoustic wave device according to claim 1, wherein a lead-out section, which is caused to extend to said chip lead in said wire lead section, is provided on a surface or in an inside of said resin base to extend from said plurality of inner leads.

6. The surface acoustic wave device according to claim 1, wherein said chip lead section and said at least one wire lead section are electrically connected via said bonding wire in an inside of said resin base.

7. The surface acoustic wave device according to claim 3, wherein said branched or extended wire lead section are is electrically connected via said bonding wire in an inside of said resin base.

8. The surface acoustic wave device according to claim 4, wherein said branched or extended wire lead section are is electrically connected via said bonding wire in an inside of said resin base.

9. The surface acoustic wave device according to claim 5, wherein said branched or extended wire lead section is electrically connected via said bonding wire in an inside of said resin base.

10. The surface acoustic wave device according to claim 3, wherein said two chip lead sections are provided for said one chip, wherein a given space is taken between said chip lead section metal surfaces for each of said chip lead sections, wherein said chip lead section metal surface is provided for one side of said branched inner lead, and wherein said wire lead section metal surface for said wire lead section is provided for other thereof.

11. The surface acoustic wave device according to claim 1, wherein said two chip lead sections are provided for one said chip, and wherein a given space is taken between said chip lead section metal surfaces for each of said chip lead sections, and wherein said inner leads of said two chip lead sections are arranged on different both sides in which said inner leads of said wire lead section are arranged.

12. The surface acoustic wave device according to claim 11, wherein each of said two chip lead sections and said wire lead section are electrically connected via said bonding wire in an inside of said resin base.

13. The surface acoustic wave device according to claim 1, wherein an electric connection of said wire lead section and an electrode of said chip is carried out by use of a golden ball by a flip chip process.

14. The surface acoustic wave device according to claim 1, wherein said chip lead section metal surface partially traverses an underside of said chip.

15. The surface acoustic wave device according to claim 1, wherein said chip lead section traverses completely across an underside of said chip.

16. The surface acoustic wave device according to claim 1, wherein said inner leads comprise a Fe—Cu alloy.

17. The surface acoustic wave device according to claim 1, wherein said chip lead section metal surface comprises a Fe—Cu alloy.

18. The surface acoustic wave device according to claim 1, wherein an inner lead-in section is provided between at least one said inner lead and said chip lead section.

19. The surface acoustic wave device according to claim 1, wherein an area of said chip lead section metal surface is smaller than an area of said chip.

20. A surface acoustic wave device, comprising:

a plurality of inner leads;

a chip comprising piezoelectric substrate mounted on a resin base into which said plurality of inner lead are molded integrally;

a wire lead section metal surface that is formed by exposing a wire lead section, which is electrically connected with an electrode of said chip through a bonding wire, out of said inner leads that are arranged on both sides of said chip, from said resin base; and a chip lead section metal surface, which is completely covered with said chip, with a predetermined area exposed from said resin base.

21. The surface acoustic wave device according to claim 20, wherein two chip lead sections form said chip lead section metal surface and are spaced at a predetermined distance and arranged in a direction where a plurality of said inner leads are arrayed.

22. The surface acoustic wave device according to claim 20, wherein said chip lead section metal surface and said wire lead section are electrically connected via said bonding wire in an interior said resin base.

* * * * *